United States Patent
Frohberg et al.

(10) Patent No.: US 7,517,816 B2
(45) Date of Patent: Apr. 14, 2009

(54) TECHNIQUE FOR CREATING DIFFERENT MECHANICAL STRESS IN DIFFERENT CHANNEL REGIONS BY FORMING AN ETCH STOP LAYER HAVING DIFFERENTLY MODIFIED INTRINSIC STRESS

(75) Inventors: Kai Frohberg, Meissen (DE); Matthias Schaller, Dresden (DE); Massud Aminpur, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 396 days.

(21) Appl. No.: 11/058,035

(22) Filed: Feb. 15, 2005

(65) Prior Publication Data

US 2005/0263825 A1   Dec. 1, 2005

(30) Foreign Application Priority Data

May 28, 2004  (DE)  ................. 10 2004 026 149

(51) Int. Cl.
- H01L 21/31 (2006.01)
- H01L 21/469 (2006.01)
- H01L 21/8238 (2006.01)

(52) U.S. Cl. .............. 438/783; 438/211; 438/761; 438/199

(58) Field of Classification Search .......... 438/199, 438/211, 761, 783
See application file for complete search history.

(56) References Cited

U.S. PATENT DOCUMENTS

| 5,936,300 | A | 8/1999 | Sasada et al. | 257/632 |
|---|---|---|---|---|
| 6,573,172 | B1 | 6/2003 | En et al. | 438/626 |
| 6,911,386 | B1 * | 6/2005 | Lee et al. | 438/612 |
| 6,939,814 | B2 * | 9/2005 | Chan et al. | 438/778 |
| 2003/0040158 | A1 | 2/2003 | Saitoh | 438/279 |
| 2003/0181005 | A1 * | 9/2003 | Hachimine et al. | 438/231 |
| 2004/0029323 | A1 | 2/2004 | Shimizu et al. | 438/142 |
| 2004/0075148 | A1 | 4/2004 | Kumagai et al. | 257/369 |
| 2004/0104405 | A1 * | 6/2004 | Huang et al. | 257/199 |

FOREIGN PATENT DOCUMENTS

WO   WO 2004/049406   6/2004

OTHER PUBLICATIONS

Quirk, Michael and Julian Serda, Semiconductor Manufacturing Technology, pp. 443, 456-459, 464-465, Prentice Hall, 2001.*
Van Zant, Peter, Microchip Fabrication, Fifth Edition, pp. 262-264, 272-273, McGraw-Hill, 2004.*

* cited by examiner

Primary Examiner—M. Wilczewski
Assistant Examiner—Daniel Luke
(74) Attorney, Agent, or Firm—Williams, Morgan & Amerson, P.C.

(57) ABSTRACT

By providing a contact etch stop layer, the stress in channel regions of different transistor types may be effectively controlled, wherein tensile and compressive stress portions of the contact etch stop layer may be obtained by well-established processes, such as wet chemical etch, plasma etch, ion implantation, plasma treatment and the like. Hence, a significant improvement in transistor performance may be obtained while not significantly contributing to process complexity.

6 Claims, 12 Drawing Sheets

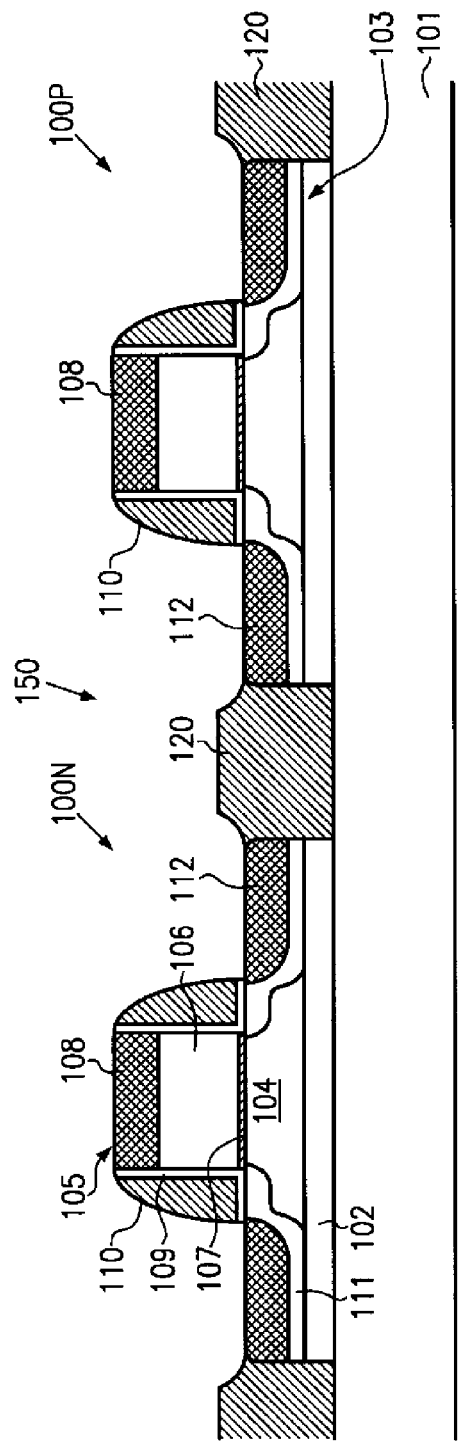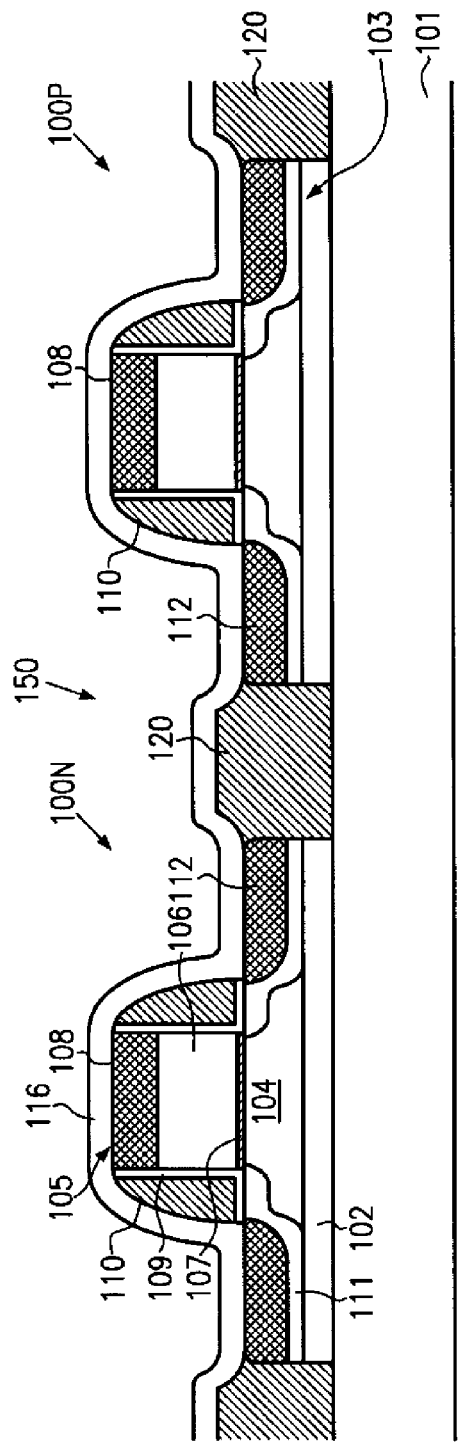

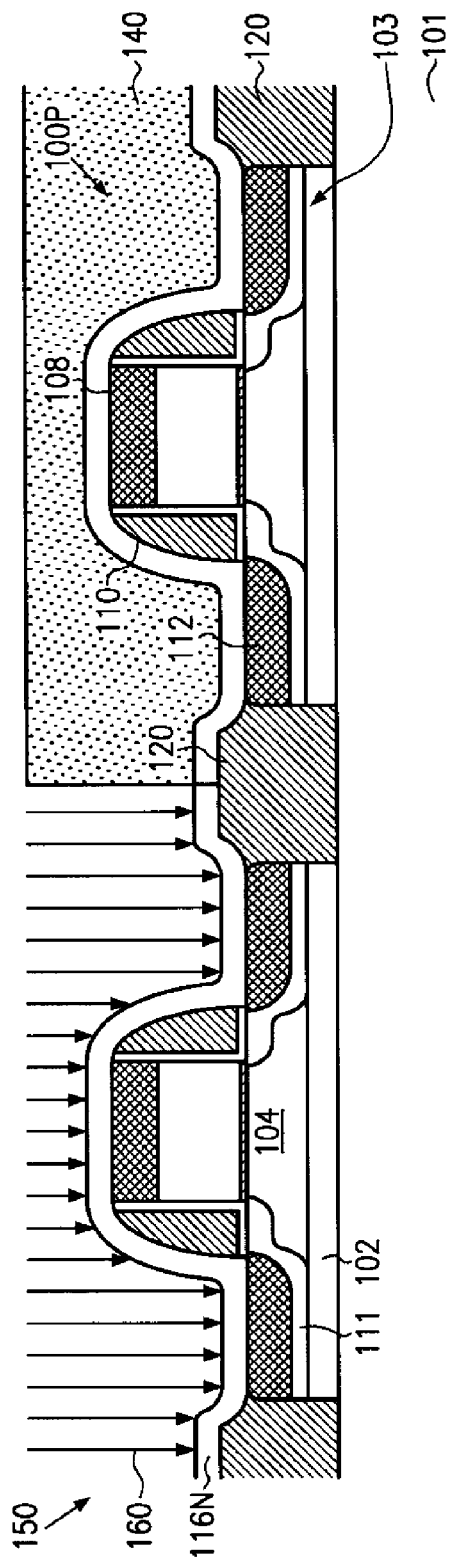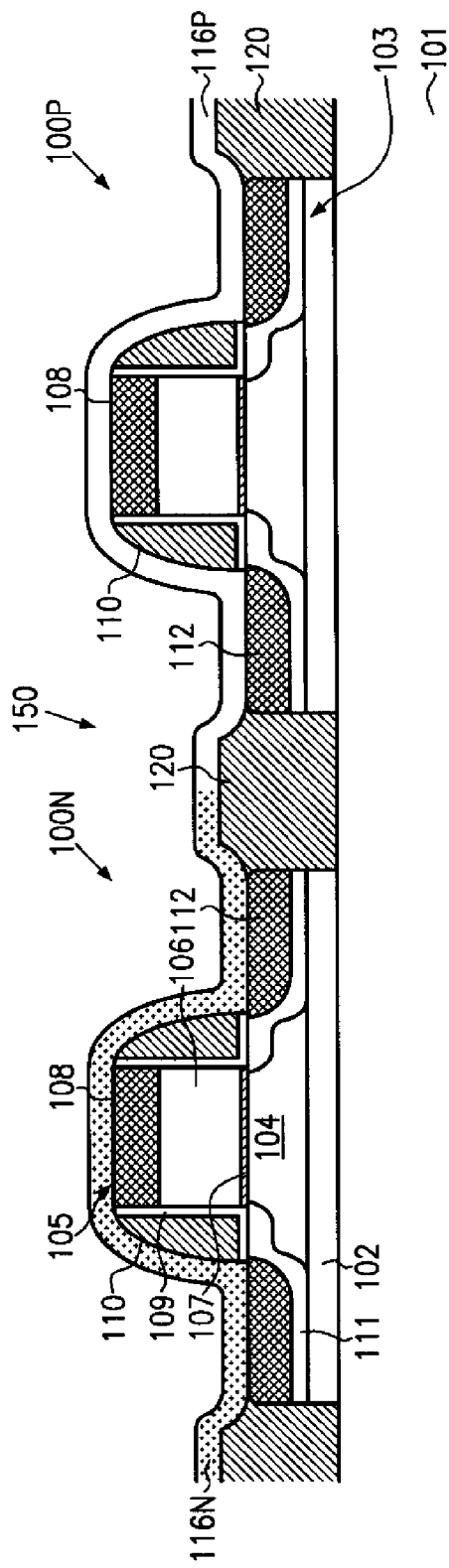
Fig.1c
Fig.1d

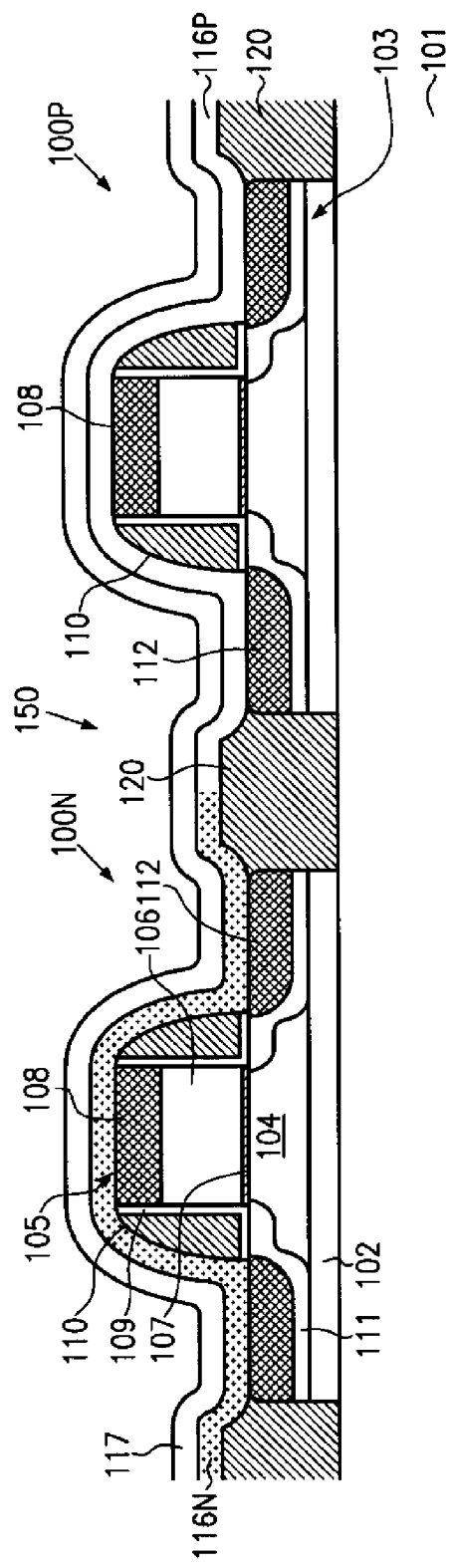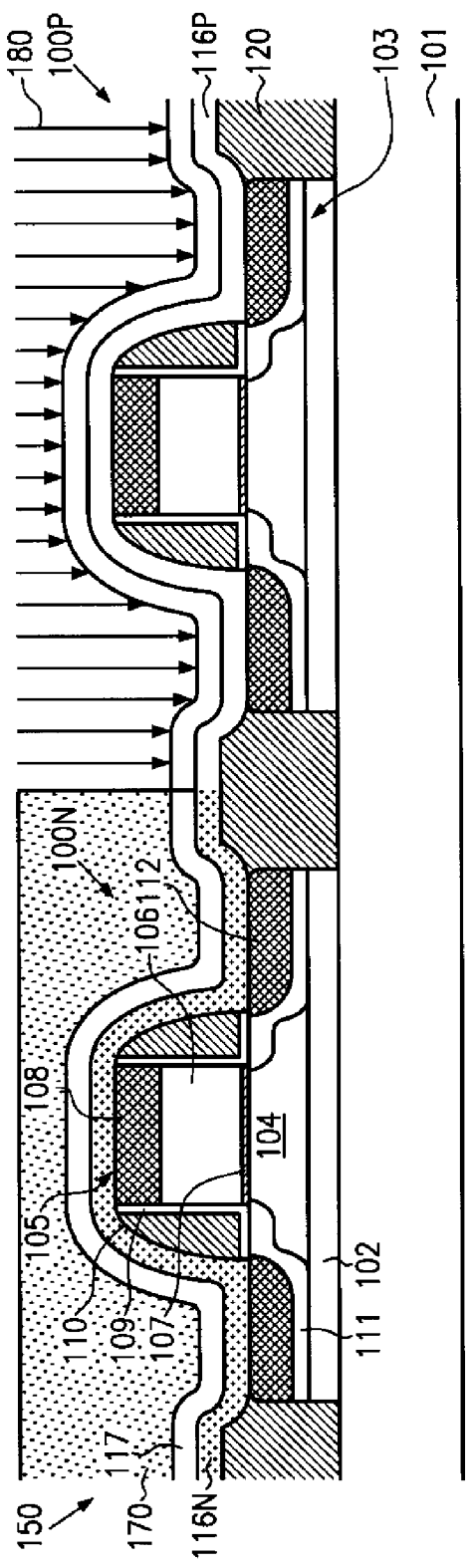

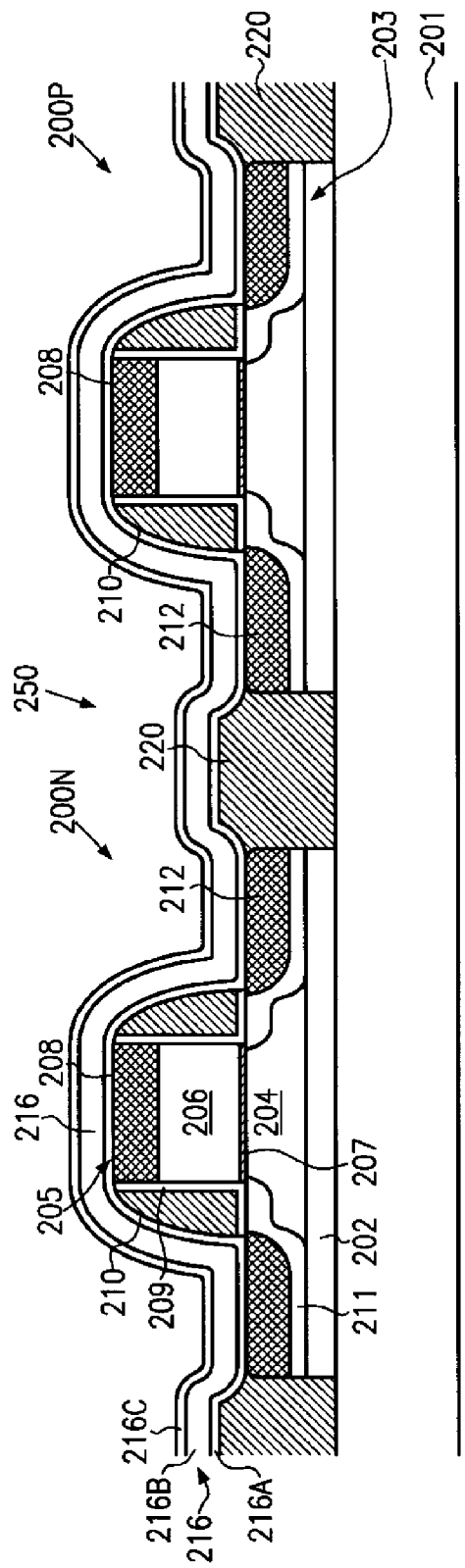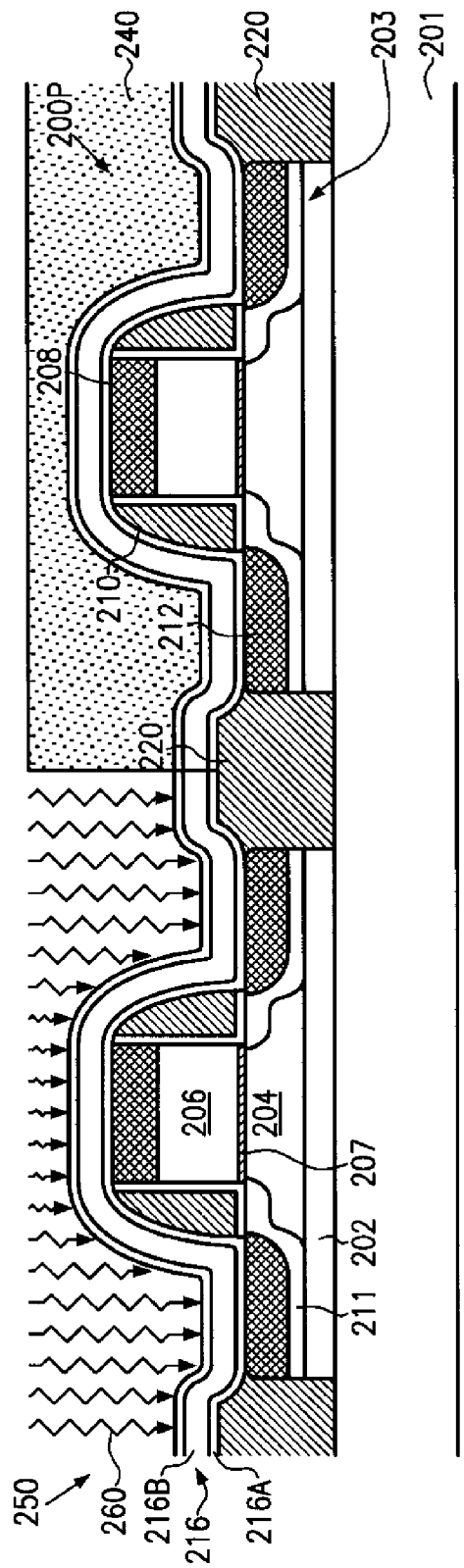

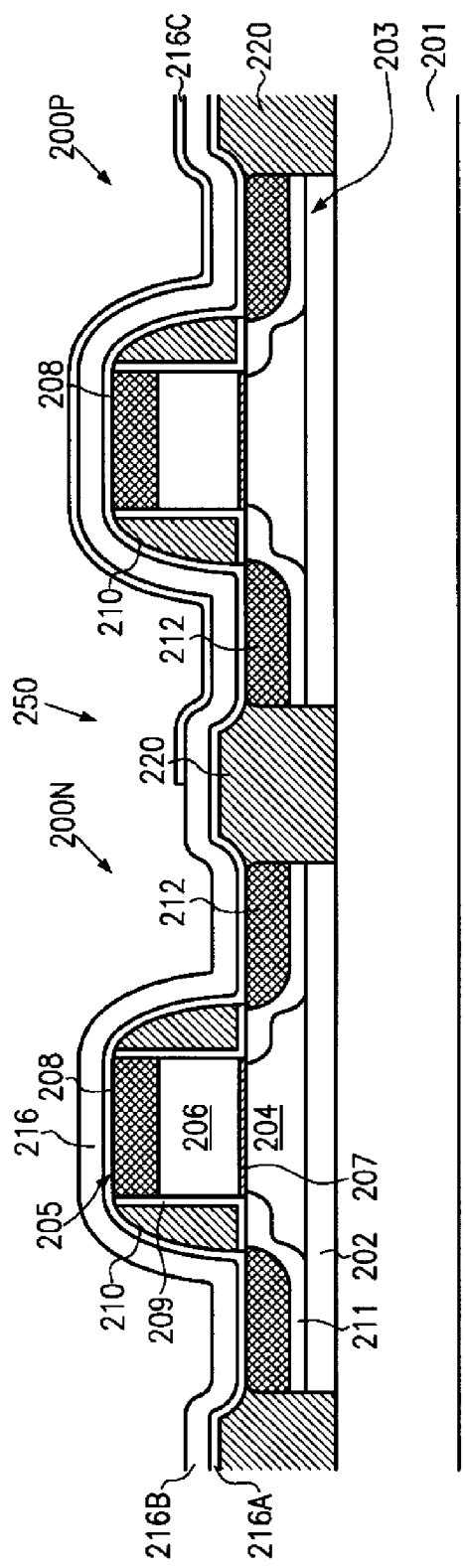
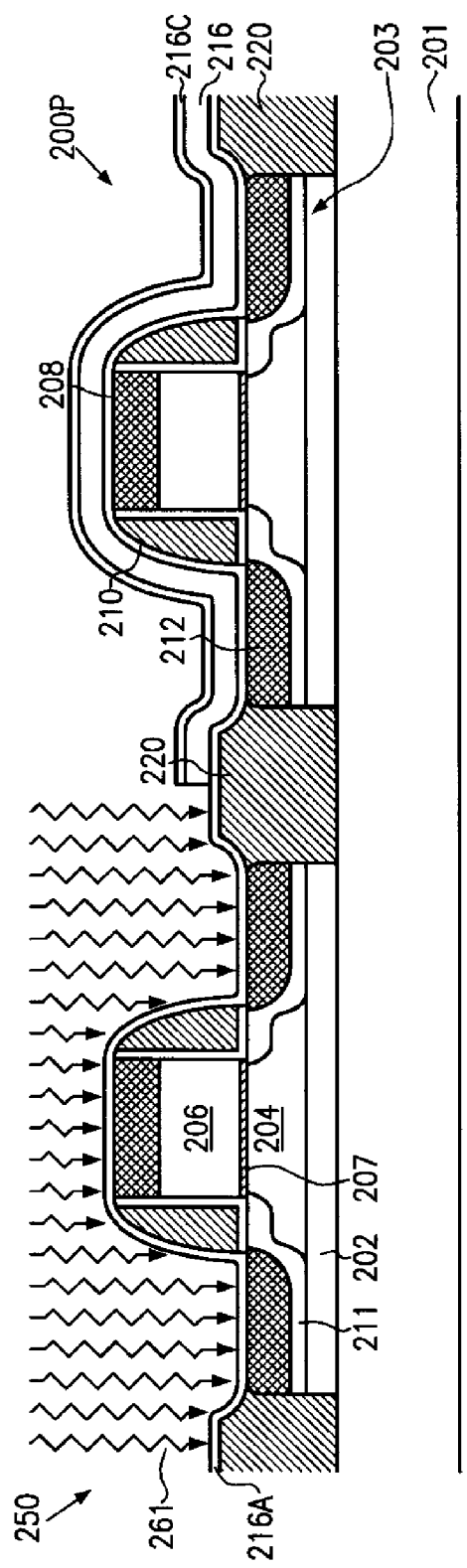
Fig.2d
Fig.2e

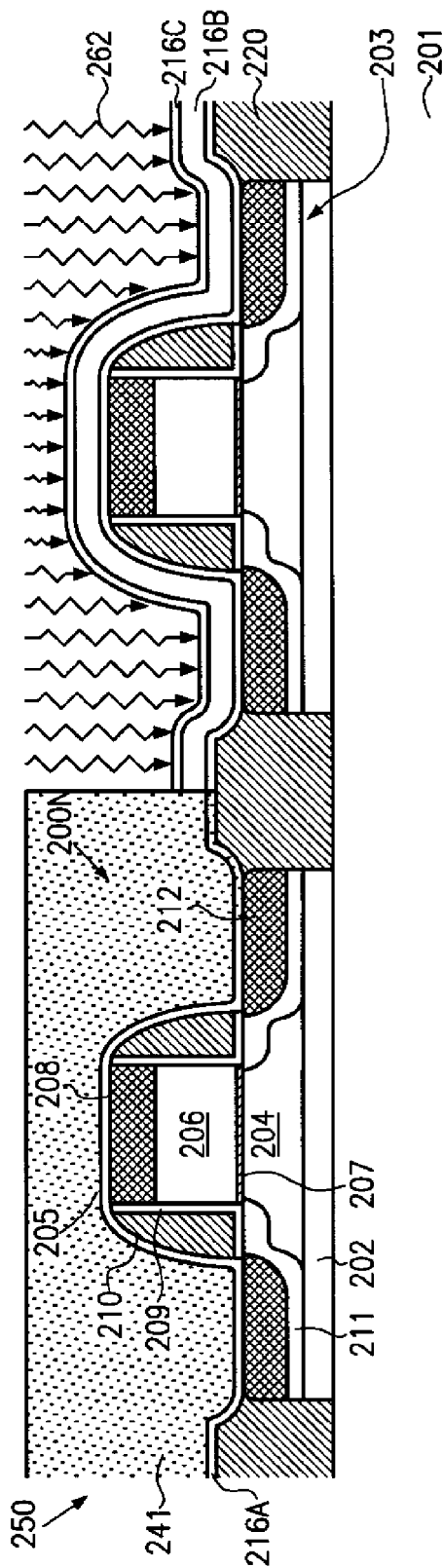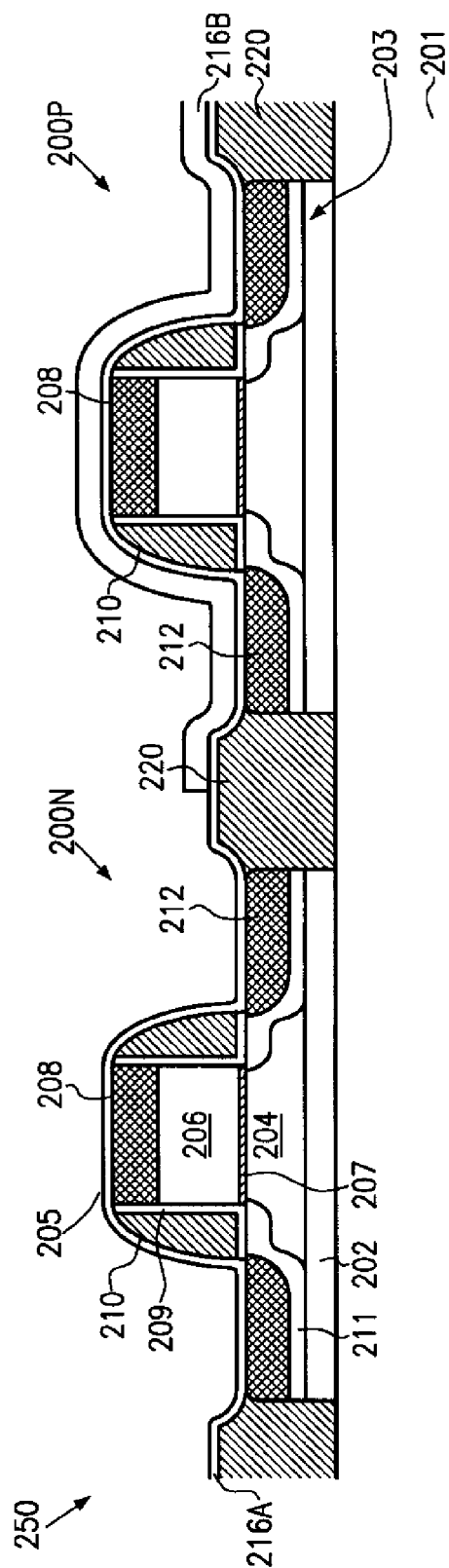

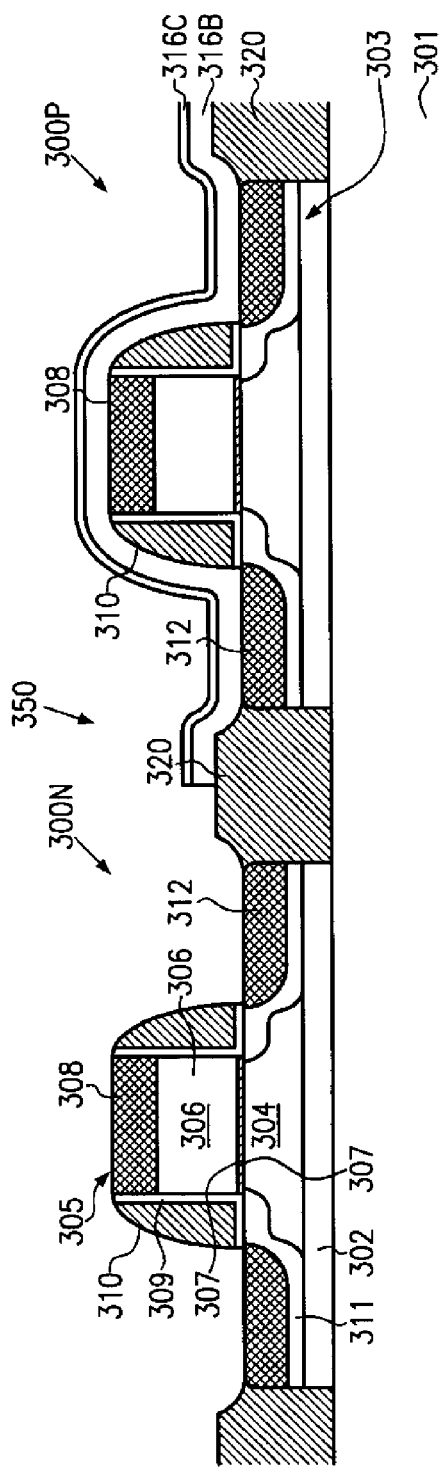
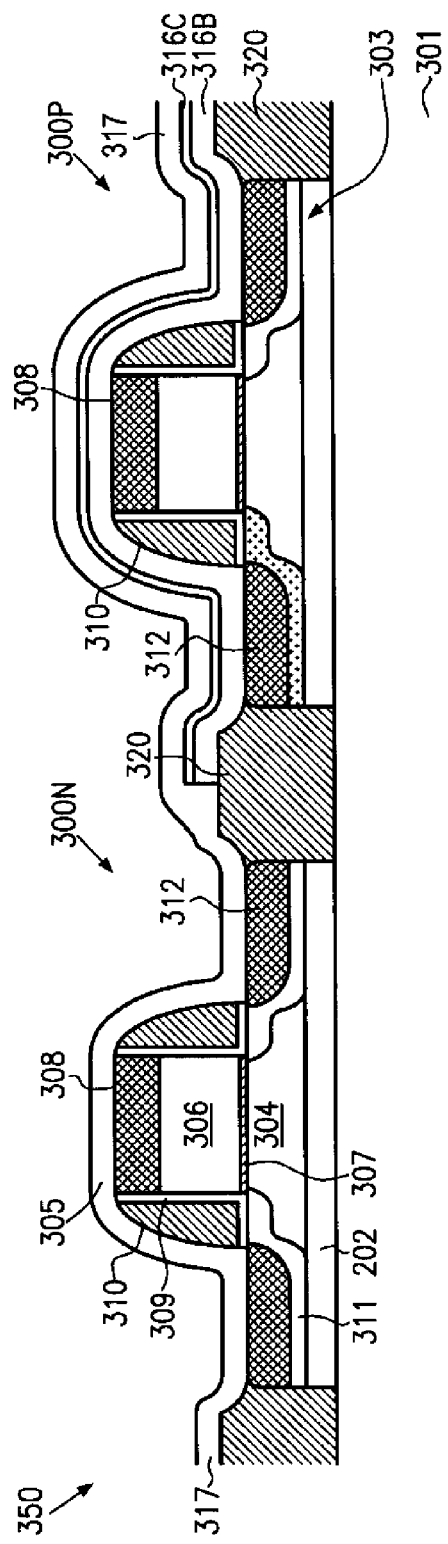
Fig.3d
Fig.3e

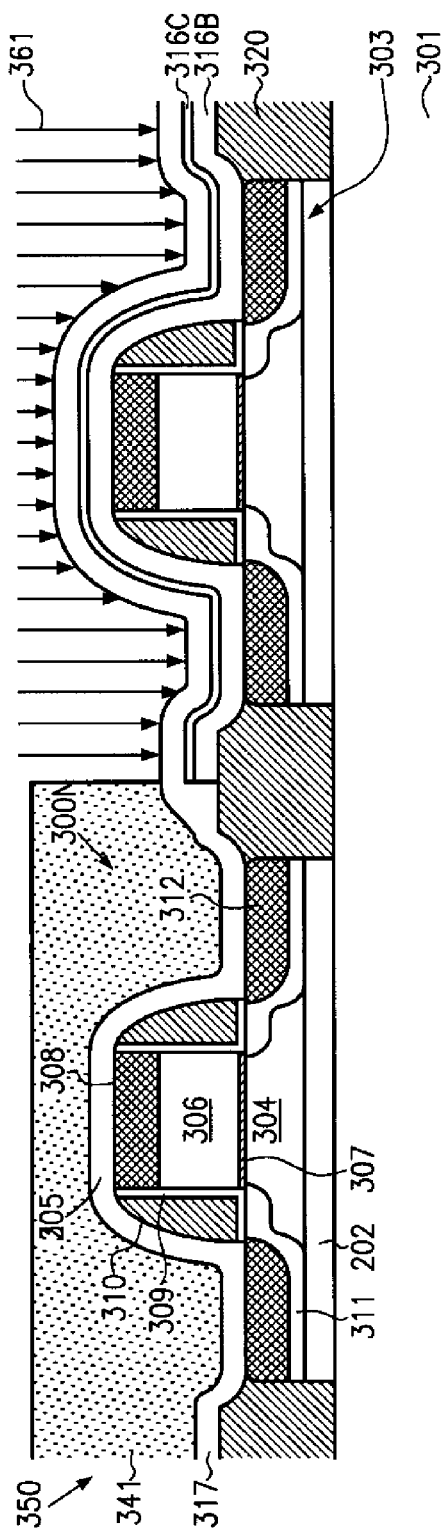
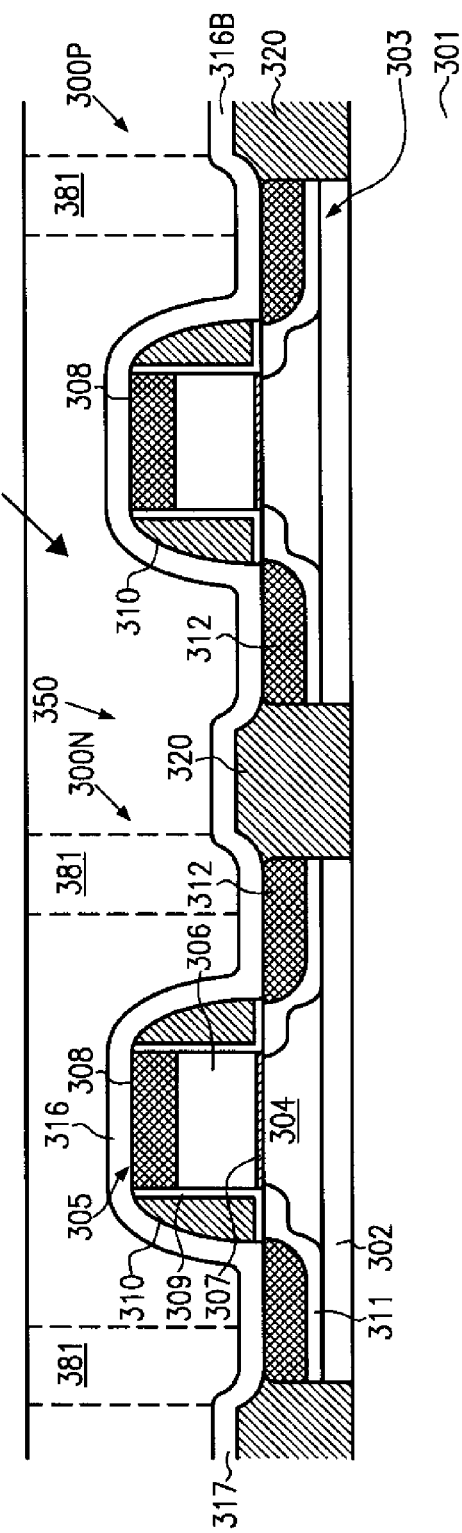
Fig.3f
Fig.3g

TECHNIQUE FOR CREATING DIFFERENT MECHANICAL STRESS IN DIFFERENT CHANNEL REGIONS BY FORMING AN ETCH STOP LAYER HAVING DIFFERENTLY MODIFIED INTRINSIC STRESS

BACKGROUND OF THE INVENTION

1. Field of the Invention

Generally, the present invention relates to the formation of integrated circuits, and, more particularly, to the formation of field effect transistors having a channel region with a specified intrinsic stress to improve the charge carrier mobility.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source regions. The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, entails a plurality of issues associated therewith that have to be addressed to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide an increased conductivity of the raised drain and source regions, while at the same time maintaining a shallow PN junction with respect to the gate insulation layer.

Irrespective of the technological approach used, sophisticated spacer techniques are necessary to create the highly complex dopant profile and to serve as a mask in forming metal silicide regions in the gate electrode and the drain and source regions in a self-aligned fashion. Since the continuous size reduction of the critical dimensions, i.e., the gate length of the transistors, necessitates the adaptation and possibly the new development of process techniques concerning the above-identified process steps, it has been proposed to also enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive stress, which results in a modified mobility for electrons and holes, respectively. For example, creating tensile stress in the channel region increases the mobility of electrons, wherein, depending on the magnitude of the tensile stress, an increase in mobility of up to 20% may be obtained, which, in turn, may directly translate into a corresponding increase in the conductivity. On the other hand, compressive stress in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress. Although the transistor performance may be considerably enhanced by the introduction of stress-creating layers in or below the channel region, significant efforts have to be made to implement the formation of corresponding stress layers into the conventional and well-approved CMOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

Moreover, inducing stress in a reliable and controlled fashion by other components such as spacer elements is difficult, since the spacer formation process has to be thoroughly adapted to the implantation process and silicidation especially for extremely scaled devices and therefore offers little flexibility for process variations to also cover any requirements with regards to stress characteristics.

In view of the above-described situation, there exists a need for an alternative technique that enables the creation of desired stress conditions in the transistor structure without requiring complex and expensive epitaxial growth techniques or variations of critical manufacturing steps, such as the spacer formation.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the creation of desired stress conditions within the channel region of different transistor elements by modifying the stress characteristics of a contact etch stop layer that is formed after completion of the basic transistor structure for forming contact openings to the gate and drain and source terminals in an interlayer dielectric material. As is well known, upon shrinking the feature sizes of transistor elements, a reliable and precise control of mechanical stress induced in the transistor element becomes more and more important to cope with effects such as nucleation of defects, void formation, modification of electrical behavior, and the like, wherein particularly the stress induced modification of the electrical behavior may positively be used to enhance the device performance. The effective control of mechanical stress in the channel region, i.e., effective stress engineering, may be accomplished by considering the influence of the sidewall spacers and the contact etch stop layer, as both of these layers are directly placed over the transistor structure. According to the present invention, effective stress engineering may be achieved by modifying the intrinsic stress characteristics of the contact etch stop layer to provide different stress conditions for different transistor elements, while at the same time maintaining a high degree of compatibility with conventional and well established process techniques.

According to one illustrative embodiment of the present invention, a method comprises forming a dielectric layer over a first transistor element and a second transistor element, wherein the dielectric layer has a first specified intrinsic mechanical stress. Moreover, a mask layer is formed above the first and second transistor elements to expose a first portion of the dielectric layer formed above the first transistor element and to cover a second portion of the dielectric layer formed above the second transistor element. Finally, the first intrinsic stress in the first portion is modified to a modified intrinsic stress by means of ion bombardment of the first portion.

According to still another illustrative embodiment of the present invention, a method comprises forming a first dielectric layer over a first transistor element and a second transistor element, wherein the first dielectric layer has a first specified intrinsic mechanical stress. Furthermore, a first portion of the first dielectric layer formed over the first transistor element is selectively removed. Additionally, a second dielectric layer is formed over the first transistor element and a second portion of the first dielectric layer formed above the second transistor element, wherein the second dielectric layer has a second intrinsic stress that differs from the first intrinsic stress. Finally, a second portion of the second dielectric layer formed above the second portion of the first dielectric layer is selectively removed.

According to yet another illustrative embodiment of the present invention, a semiconductor device comprises a first transistor element having a first channel region and a first dielectric layer enclosing the first transistor element, wherein the first dielectric layer induces a first stress in the first channel region. Moreover, the semiconductor device comprises a second transistor element having a second channel region and a second dielectric layer, wherein the second dielectric layer encloses the second transistor element and induces a second stress in the second channel region, whereby the second stress differs from the first stress.

BRIEF DESCRIPTION OF THE DRAWINGS

The invention may be understood by reference to the following description taken in conjunction with the accompanying drawings, in which like reference numerals identify like elements, and in which:

FIGS. 1a-1g schematically show cross-sectional views of a semiconductor device including two transistor elements at various manufacturing stages, wherein the intrinsic mechanical stress of a contact etch stop layer is modified by means of a treatment with non-reactive ions in accordance with illustrative embodiments of the present invention;

FIGS. 2a-2j schematically show cross-sectional views of a semiconductor device including two different transistor elements, wherein the intrinsic stress of the contact etch stop layer is modified by a treatment with non-reactive ions in accordance with further illustrative embodiments of the present invention; and FIGS. 3a-3g schematically show cross-sectional views of a semiconductor device including two different transistor types, which receive correspondingly designed contact etch stop layers by selectively removing portions thereof by means of dry etch techniques in accordance with further illustrative embodiments of the present invention.

Figure 1G:
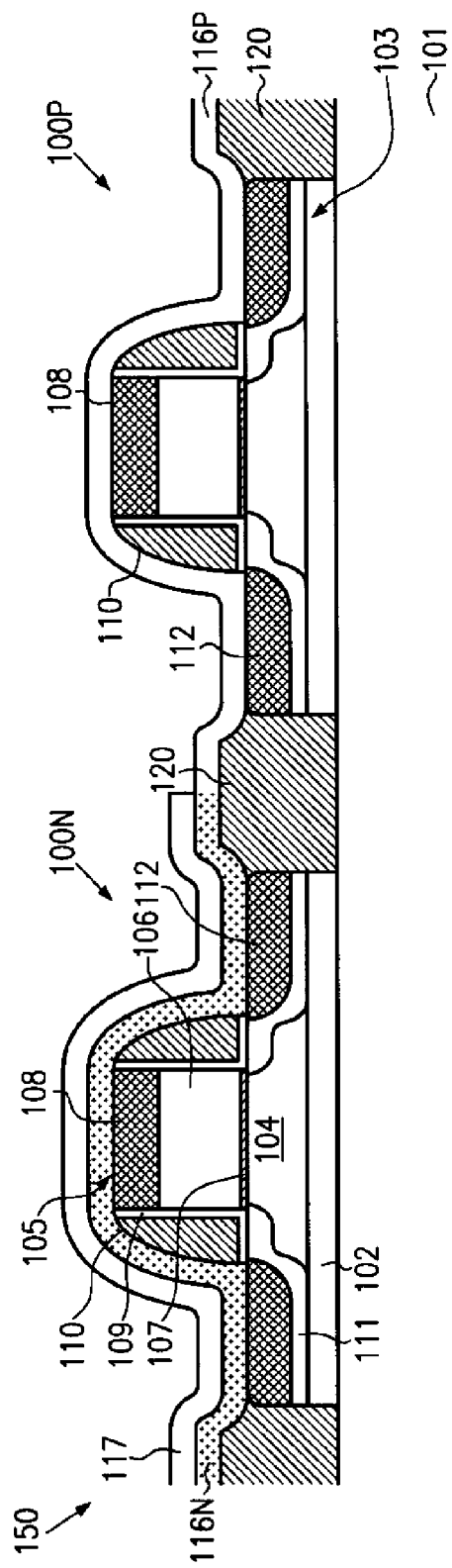

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that effective stress engineering in the channel region of different transistor types may efficiently be accomplished by modifying the intrinsic stress of a dielectric layer that is in contact with the transistor structure or that is at least located in the vicinity of the transistor structure. The modification of the intrinsic stress of the dielectric layer may be accomplished by adjusting process parameters and/or by a treatment with non-reactive ions. Since the dielectric layer located above the transistor structure, which may also be used, at least partially, as a contact etch stop layer, covers a large area of the transistor structure, the mechanical coupling to the transistor structure enables effective stress engineering within the channel region without requiring significant modifications during the transistor formation process. Moreover, the present invention enables the modification or formation of corresponding dielectric layers with different stress characteristics at different die locations or even at different dies within the substrate. Thus, on a "local scale," the present invention enables the formation of different stress inducing dielectric layers at transistor elements that are arranged in close proximity, such as complementary transistor pairs of a CMOS device, thereby providing the potential for enhancing the overall performance of even complex CMOS devices, such as CPUs, memory chips, and the like. Hence, for a given transistor geometry, that is, for a given technology node, a higher operating speed at the same leakage level may be achieved, or for a given operating speed, the leakage currents, and thus the power consumption, may be reduced. On a more global scale, process non-uniformities resulting in a deviation of electrical characteristics of devices located at different positions of a wafer, or deviations in devices formed on different wafers, may be reduced or compensated for by selectively adapting the stress level at different wafers or wafer positions, wherein the stress adaptation takes place at the transistor level, i.e., in the channel regions of the involved transistor devices and therefore renders the stress engineering highly efficient.

As previously discussed, the stress-induced problems become more relevant with increasing shrinkage of feature sizes, and hence the present invention is particularly advantageous in combination with highly scaled semiconductor devices, thereby providing the prospect for further device scaling without substantial loss of performance caused by stress-induced problems.

With reference to the drawings, further illustrative embodiments of the present invention will now be described in more detail. FIG. 1a schematically shows a cross-sectional view of a semiconductor device 150 comprising a first transistor element 100n and a second transistor element 100p. The transistor elements 100n, 100p may represent different types of transistor elements, such as an N-channel transistor and a P-channel transistor, or transistors of the same or different types located at different die locations or substrate locations, and, in particular embodiments, the transistors 100n may represent an N-channel transistor and the second transistors loop may represent a P-channel transistor, both of which are arranged to form a complementary transistor pair. Although the transistors 100n and 100p may differ from each other in size, conductivity type, location, function, and the like, for convenience, the transistors shown have substantially the same configuration, and hence corresponding components of the transistors 100n and 100p are denoted by the same reference numerals. It should also be noted that although the present invention is particularly advantageous for transistor elements without any stress-inducing components, such as additional epitaxy layers formed in or below the respective channel regions, the present invention may also be combined with such additional stress-creating techniques. It should also be appreciated that in the following description of further illustrative embodiments of the present invention it is referred to transistor elements provided in the form of silicon-on-insulator (SOI) devices without any raised drain and source regions. As will be clear in the course of the description, the present invention may also be applied to transistor elements formed on bulk semiconductor substrates and may also be readily applied to transistor designs using raised drain and source regions.

The semiconductor device 150 comprises a substrate 101 having formed thereon an insulating layer 102, such as a buried silicon dioxide layer, silicon nitride layer, and the like, followed by a crystalline semiconductor layer 103, which will be referred to as "silicon layer" in the following description, since the vast majority of integrated circuits including complex logic circuits is based on silicon. It should be appreciated, however, that the semiconductor layer 103 may be comprised of any appropriate semiconductor material in conformity with design requirements. The first and second transistors 100n, 100p may be separated from each other by an isolation structure 120, for instance, in the form of a shallow trench isolation. The first transistor 100n further comprises a gate electrode structure 105 including a semiconductor portion 106, such as a polysilicon portion, and a metal-containing portion 108, for instance provided in the form of a metal silicide. The gate electrode structure 105 further comprises a gate insulation layer 107 separating the gate electrode structure 105 from a channel region 104, which, in turn, laterally separates appropriately doped source and drain regions 111 having formed therein metal silicide regions 112. A spacer element 110 is formed adjacent the sidewalls of the gate electrode structure 105 and is separated therefrom by a liner 109, which is also formed between the source and drain regions 111 and the spacer element 110. In some cases, the liner 109 may be omitted.

The second transistor 100p may have substantially the same configuration and the same components, wherein the channel region 104 and the drain and source regions 111 may include different dopants compared to the respective regions of the transistor 100n, when the first and second transistors 100n, 100p represent transistor elements of a different conductivity type.

A typical process flow for forming the semiconductor device 150 as shown in FIG. 1a may comprise the following processes. The substrate 101, the insulating layer 102, and the semiconductor layer 103 may be formed by advanced wafer bond techniques when the semiconductor device 150 is to represent an SOI device, or the substrate 101 may be provided without the insulating layer 102, as a bulk semiconductor substrate, wherein the semiconductor layer 103 may represent an upper portion of the substrate, or may be formed by epitaxial growth techniques. Thereafter, the gate insulation layer 107 may be deposited and/or formed by oxidation in accordance with well-established process techniques followed by the deposition of a gate electrode material, such as polysilicon, by means of low pressure chemical vapor deposition (LPCVD). Thereafter, the gate electrode material and the gate insulation layer 107 may be patterned by sophisticated photolithography and etch techniques in accordance with well-established process recipes. Next, implantation cycles in combination with the manufacturing process for forming the spacer element 110 may be performed, wherein the spacer element 110 may be formed as two or more different spacer elements with intermediate implantation processes when a sophisticated laterally profiled dopant concentration is required for the drain and source regions 111. For example, extension regions of reduced penetration depth may be required. After any anneal cycles for activating and partially curing implantation-induced crystal damage, the metal silicide regions 108 and 112 are formed by depositing a refractory metal and initiating a chemical reaction with the underlying silicon, wherein the spacer element 110 acts as a reaction mask for preventing or reducing the formation of the metal compound between the gate electrode structure 105 and the drain and source regions 111.

FIG. 1b schematically shows the semiconductor device 150 with a first dielectric layer 116 formed above the transistor elements 100n and 100p. Typically, the transistor elements 100n, 100p are embedded in an interlayer dielectric material (not shown in FIG. 1b) over which corresponding metallization layers are to be formed to establish the required electrical connections between the individual circuit elements. The interlayer dielectric material has to be patterned to provide contacts to the gate electrode structure 105 and the drain and source regions 111 by means of an anisotropic etch process. Since this anisotropic etch process has to be performed to different depths, a reliable etch stop layer is usually provided to prevent a material removal at the gate electrode structure 105 when the etch front has reached the gate electrode structure 105 and still continues to approach the drain and source regions 111. Hence, in particular embodiments, the first dielectric layer 116 is designed to also act, at least partially, as an etch stop layer for a contact etch and may therefore also be referred to as contact etch stop layer. Frequently, the interlayer dielectric material is comprised of silicon dioxide and thus the first dielectric layer 116 may comprise silicon nitride, as silicon nitride exhibits a good etch selectivity for well-established anisotropic process recipes for etching silicon dioxide. In particular, silicon nitride may be deposited in accordance with well-established deposition recipes, wherein the deposition parameters may be adjusted to provide a specified intrinsic mechanical stress while at the same time still maintaining the desired high etch selectivity to silicon dioxide. Typically, silicon nitride is deposited by plasma enhanced chemical vapor deposition (PECVD), wherein, for example, parameters of the plasma atmosphere, such as the bias power supplied to the plasma atmosphere, may be varied to adjust the mechanical stress created in the silicon nitride layer as deposited. For example, the deposition may be performed on the basis of well-established process recipes on the basis of silane ($SiH_4$) and ammonia ($NH_3$), nitrogen oxide ($N_2O$) or nitrogen ($N_2$) in a deposition tool for PECVD for a silicon nitride layer. The stress in the silicon nitride layer may be determined by the deposition conditions, wherein, for instance, a compressive stress in silicon nitride of approximately 150 MPa may be obtained with a moderately high bias power according to well-established deposition recipes, while in other embodiments a tensile stress of approximately 0-1000 MPa may be achieved. In general, the stress created in the silicon nitride during the deposition depends on the gas mixture, the deposition rate, the temperature and the ion bombardment. According to well-known recipes, the corresponding amount of tensile or compressive stress in the layer may be adjusted by, for instance, varying any of these process parameters determining the plasma atmosphere during the deposition of the layer by PECVD. In particular, the bias energy supplied to the plasma atmosphere may be varied to adjust the degree of ion bombardment during the deposition process, thereby creating tensile or compressive stress in the silicon nitride layer. To create a desired ion bombardment, dual frequency CVD reactors are usually used to adjust a desired amount of bias power. For example, if the low-frequency supply is significantly reduced or turned off, a silicon nitride layer having a tensile stress is created. On the other hand, moderately high bias power creates compressive stress in the silicon nitride layer. A corresponding deposition process may be performed with any deposition tool that enables the generation of an appropriate plasma atmosphere.

For example, the first dielectric layer 116 may be deposited as a silicon nitride layer having a specified compressive stress. It should be noted that corresponding process recipes for depositing silicon nitride having a desired magnitude of compressive or tensile stress may also be readily established on the basis of test substrates, wherein one or more process parameters are varied and the stress characteristics of the silicon nitride layers are measured and correlated with the respective process parameters. In the following description, it is assumed that the first dielectric layer 116 comprises compressive stress, while in other embodiments it may be formed with tensile stress.

FIG. 1c schematically shows the semiconductor device 150 with a resist mask 140 formed thereon, wherein the resist mask 140 exposes the first transistor element 100n and covers the second transistor element 100p. The resist mask 140 may be formed in accordance with photolithography masks also required for the formation of P- and N-type transistors, and thus the formation of the resist mask 140 may be readily incorporated into the conventional process flow. Moreover, the semiconductor device 150 is subjected to a treatment 160 with non-reactive ions, including, for instance, xenon, germanium, and the like, when the treatment 160 is performed as an ion implantation sequence. Due to the ion bombardment, the molecular structure of a first portion 116n of the layer 116 is modified to significantly reduce the intrinsic stress within the first portion 116n of the layer 116. The process parameters of the treatment 160 when performed as an ion implantation process may be selected in accordance with a layer thickness of the first dielectric layer 116 and the type of ion species used. For instance, a dose of approximately $10^{15}$-$10^{16}$ ions/$cm^2$ may be used at an implantation energy of approximately 10-100 keV for a layer thickness of approximately 50-100 nm for the above-specified ion species. However, relevant parameter values may readily be determined by simulation. In other embodiments, the treatment 160 may be performed in a plasma atmosphere on the basis of inert gases such as argon, helium, and the like, which show a higher penetration depth at lower acceleration energies, thereby also rendering the ion energies created in a plasma atmosphere appropriate for relaxing the intrinsic stress in the portion 116n. An appropriate plasma atmosphere may be generated in any appropriate plasma etch or plasma deposition tool.

FIG. 1d schematically shows the semiconductor device 150 after completion of the ion bombardment 160 with a stress-reduced or a substantially stress-free portion 116n, depending on the design requirements, provided over the first transistor 100n and with a portion 116p still having the compressive stress of the initially deposited dielectric layer 116. In some embodiments, the reduced intrinsic stress of the first portion 116n or the significantly reduced compressive stress may be considered appropriate for achieving the desired modification of the electrical behavior of the channel region 104 of the first transistor 100n to achieve a substantially symmetrical behavior of the first and second transistors 100n, 100p, and the further processing of the semiconductor device 150 may be continued by depositing an interlayer dielectric material, such as silicon dioxide, and forming corresponding contact openings while using the first and second portions 116n, 116p as etch stop layers.

FIG. 1e shows the semiconductor device 150 in accordance with further illustrative embodiments when a more pronounced modification of the stress condition in the channel region 104 of the first transistor 100n is desired. As previously explained, if the transistor 100n is to represent an N-type transistor, a tensile stress within the channel region 104 may provide enhanced mobility of electrons. Therefore, a second dielectric layer 117 may be formed over the first and second transistors 100n, 100p having an intrinsic stress as is desired for the first transistor 100n. For example, the dielectric layer 117 may be deposited to exhibit an intrinsic tensile stress of a specified magnitude. In some embodiments, the compressive stress in the second portion 116p may be selected to significantly overcompensate the tensile stress induced by the second dielectric layer 117 to achieve a desired total stress within the channel region 104 of the second transistor 100p, e.g., a compressive stress condition. In other embodiments, the partial compensation of the compressive stress of the second portion 116p by the tensile stress of the dielectric layer 117 may be considered inappropriate and hence the intrinsic stress created by the dielectric layer 117 over the second transistor 100p may be modified, for instance by a treatment similar to the treatment 160, or in other embodiments the portion of the layer 117 over the second transistor 100p may be removed.

FIG. 1f schematically shows the semiconductor device 150 with a resist mask 170 formed thereon, which covers the first transistor element 100n while exposing the second transistor element 100p. Moreover, the second transistor 100p is subjected to a plasma etch process 180 to remove the exposed portion of the layer 117. In some embodiments, the dielectric layer 117 may comprise a thin liner (not shown) formed on the first dielectric layer 116 to provide an indication when the etch front of the plasma etch process 180 approximately reaches the second portion 116p of the layer 116, or the liner may act as an etch stop layer.

FIG. 1g schematically shows the semiconductor device 150 after removal of the exposed portion of the layer 117 and after removal of the resist mask 170. Hence, a stress created in the channel region 104 of the first transistor 100n is substantially determined by the second dielectric layer 117, while the stress in the channel region 104 of the second transistor loop is substantially determined by the second portion 116p. It should be appreciated that the type and magnitude of the intrinsic stress in the first dielectric layer 116 and the second dielectric layer 117 may be selected in accordance with design requirements and may not necessarily be selected in the way described above.

In a further embodiment, the plasma etch process 180 shown in FIG. 1f may be replaced by an ion bombardment, similar to the ion bombardment 160 in FIG. 1c, to reduce or relax the stress in the exposed portion of the dielectric layer 117 without removing the same. By appropriately selecting the implantation parameters or the parameters for a plasma atmosphere, the degree of stress relaxation may appropriately be controlled to achieve the desired total induced stress in the channel region 104 of the second transistor 100p. In this way, a substantially equivalent layer thickness for the layers 116 and 117 above the first and second transistor element 100n, 100p may be obtained, thereby providing for substantially identical etch conditions during a subsequent contact opening etch.

Moreover, in the above-described embodiments, advantageously a tensile stress in N-transistors and a compressive stress in P-transistors is generated. However, any other combination of stress may be created. In particular, more than two different stress levels at more than two different substrate positions may be obtained. For instance, the ion bombardment 160 may be performed in several steps possibly with varying parameters, wherein each step is carried out with a different resist mask 140. Similarly, the plasma etch process 180 may not completely remove the respective layer 117 and may also be performed in several steps using different resist masks 170.

Figure 2A:
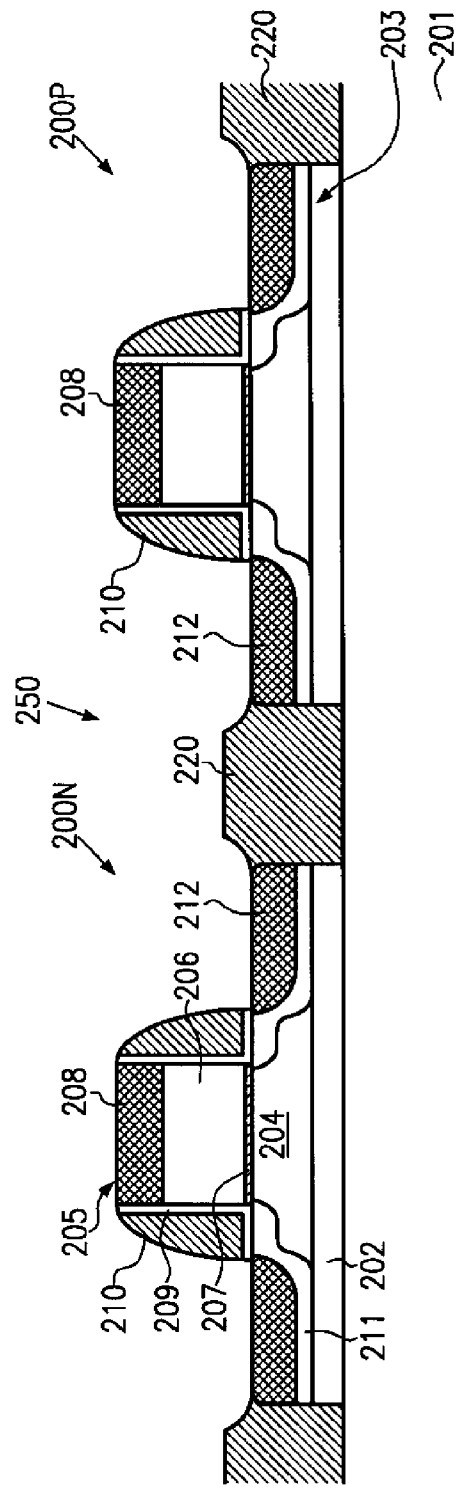

With reference to FIGS. 2a-2j, further illustrative embodiments will now be described. In FIG. 2a, a semiconductor device 250 comprises a first transistor element 200n and a second transistor element 200p. The configuration of the first and second transistors 200n and 200p may be the same as described with reference to FIG. 1a, and hence the same reference numerals are used, except for a leading "2" instead of a leading "1." Therefore, a detailed description of these components is omitted.

FIG. 2b schematically shows the semiconductor device 250 having formed thereon a first dielectric layer 216, which may comprise a first liner 216a, a stress-inducing layer 216b, and a second liner 216c. In one embodiment, the liners 216a and 216c may be formed of silicon dioxide, while the stress-inducing layer 216b may be comprised of silicon nitride. Deposition recipes for silicon dioxide are well established in the art and may therefore be readily applied to the formation of the liners 216a and 216c. Concerning the formation of the stress-inducing layer 216b, the same criteria apply as previously explained with reference to the dielectric layer 116 in FIG. 1b. For convenience, it may be assumed that the stress-inducing layer 216b comprises compressive stress, which may be transferred to the second transistor element 200p, while the first transistor 200n is to receive a tensile stress. However, in other embodiments, the stress-inducing layer 216b may have tensile stress.

FIG. 2c schematically shows the semiconductor device 250 with a resist mask 240 formed thereon, which covers the second transistor 200p and exposes the first transistor 200n. Furthermore, the semiconductor device 250 is subjected to a wet chemical etch process 260 to remove the exposed portion of the liner 216c. In one particular embodiment, the wet chemical etch process is based on diluted hydrofluoric acid (HF), which attacks the silicon dioxide of the liner 216c while having a significantly reduced etch rate for the resist mask 240. Corresponding etch recipes for selectively removing silicon dioxide by HF are well established in the art.

FIG. 2d schematically shows the semiconductor device 250 after removal of the exposed portion of the liner 216c and after removal of the resist mask 240. Thus, the second transistor element 200p is still covered by the liner 216c, while the stress-inducing layer 216b is exposed over the first transistor 200n.

In FIG. 2e, the semiconductor device 250 is subjected to a further wet chemical etch process 261, which may be designed to selectively remove the stress-inducing layer 216b while substantially not attacking the liners 216a and 216c. In one illustrative embodiment, the stress-inducing layer 216b may be comprised of silicon nitride, and hence the etch chemistry may be based on hot phosphoric acid ($H_3PO_4$), which exhibits an excellent etch selectivity with respect to silicon dioxide. Consequently, the stress-inducing layer 216b over the second transistor element 200p is maintained, except for minor under-etch areas (not shown), whereas the stress-inducing layer 216b over the first transistor element 200n is substantially completely removed.

FIG. 2f schematically shows the semiconductor device 250 with a further resist mask 241 formed thereon that covers the first transistor element 200n while exposing the second transistor element 200p. Furthermore, the semiconductor device 250 is subjected to a further wet chemical etch process 262 to remove the exposed liner 216c over the second transistor element 200p. Similar to the etch process 260, the process 262 may be based on HF if the liner 216c is comprised of silicon dioxide, whereas the liner 216a on the first transistor 200n is protected by the resist mask 241.

FIG. 2g schematically shows the semiconductor device 250 after completion of the wet chemical etch process 262 and after the removal of the resist mask 241. Hence, the second transistor 200p has the exposed stress-inducing layer 216b formed thereon, while the first transistor 200n is still covered by the liner 216a. Next, a further dielectric layer having an intrinsic stress other than the intrinsic stress of the stress-inducing layer 216b may be deposited.

Figure 2H:
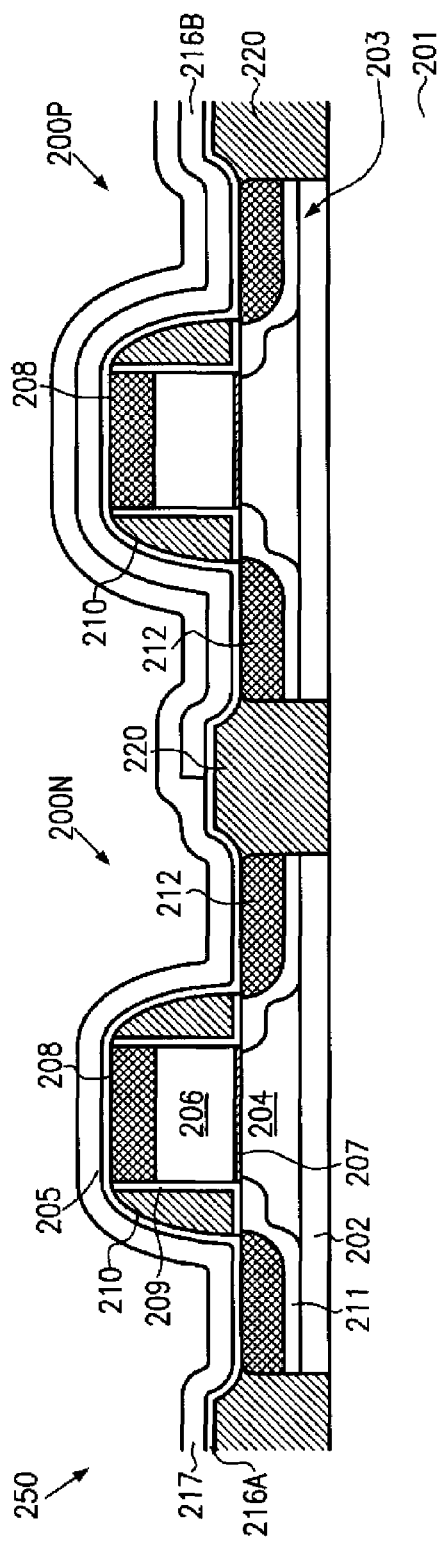

FIG. 2h shows the semiconductor device 250 having formed thereon a second dielectric layer 217 with a specified intrinsic stress, such as a tensile stress, formed over the first and second transistor elements 200n, 200p. Regarding any deposition recipes, layer characteristics such as layer thickness, material composition, etc., the same criteria apply as previously explained with reference to the layers 116, 117 and 216b. In one illustrative embodiment, the second dielectric layer 217 may be comprised of silicon nitride with a layer thickness that is appropriate for serving as a contact etch stop layer in subsequent manufacturing processes.

Figure 2I:
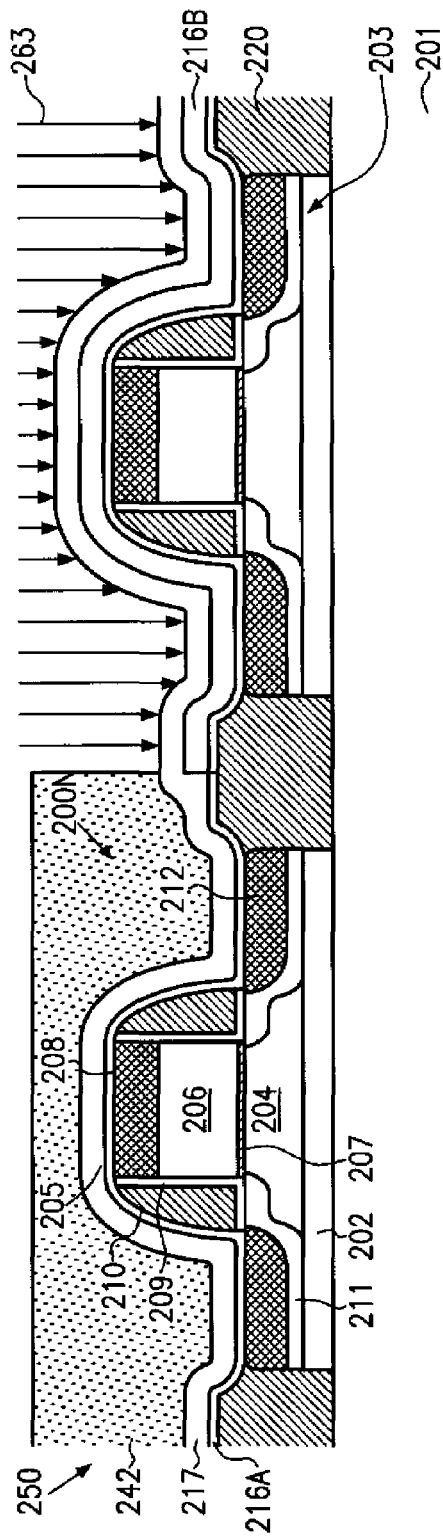

FIG. 2i schematically shows the semiconductor device 250 having formed thereon a further resist mask 242, which covers the first transistor element 200n while exposing the second transistor element 200p. Since the stress induced in the channel region 204 of the second transistor element 200p is currently determined, at least in part, by the stress-inducing layer 216b and the dielectric layer 217, the second transistor 200p may, in accordance with one embodiment, be subjected to a treatment 263 for relaxing or reducing the intrinsic stress in the layer 217. To this end, a treatment with non-reactive ions by means of an ion implantation on the basis of, for instance, xenon, germanium, and the like, may be performed, or a plasma treatment on the basis of argon, helium, and the like may be employed. The process parameters of the treatment 263 may be selected on the basis of the desired total stress in the channel region 204 of the second transistor 200p and in conformity with the characteristics of the dielectric layer 217, such as layer thickness, material composition, and the like. Corresponding process recipes and process parameters may be readily established, for instance on the basis of test runs, simulation and the like. As previously discussed with reference to the ion bombardment 160 and the plasma etch 180, the degree of stress relaxation and the position of the stress relaxation may be controlled during the treatment 263 by carrying out two or more steps with different resist masks 242 and with different process parameters.

In other embodiments, the influence of the dielectric layer 217 on the stress induced in the channel region 204 of the second transistor element 200p may be avoided by removing the exposed portion of the layer 217 by a plasma etch process, wherein, advantageously, the liner 216c is not removed (see FIG. 2f), and may therefore be used as an efficient etch stop layer or etch indicator layer during the plasma etch process to reliably control the removal of the exposed portion of the layer 217. Consequently, after this plasma etch process and the corresponding removal of the exposed portion of the layer 217, the stress in the channel region 204 of the second transistor 200p is substantially determined by the stress-inducing layer 216b, while the stress in the first transistor element 200n is substantially created by the remaining dielectric layer 217.

Again referring to FIG. 2i, after completion of the treatment 263, the exposed portion of the layer 217 is substantially relaxed, or the stress therein is significantly reduced, or adjusted to a desired level.

Figure 2J:
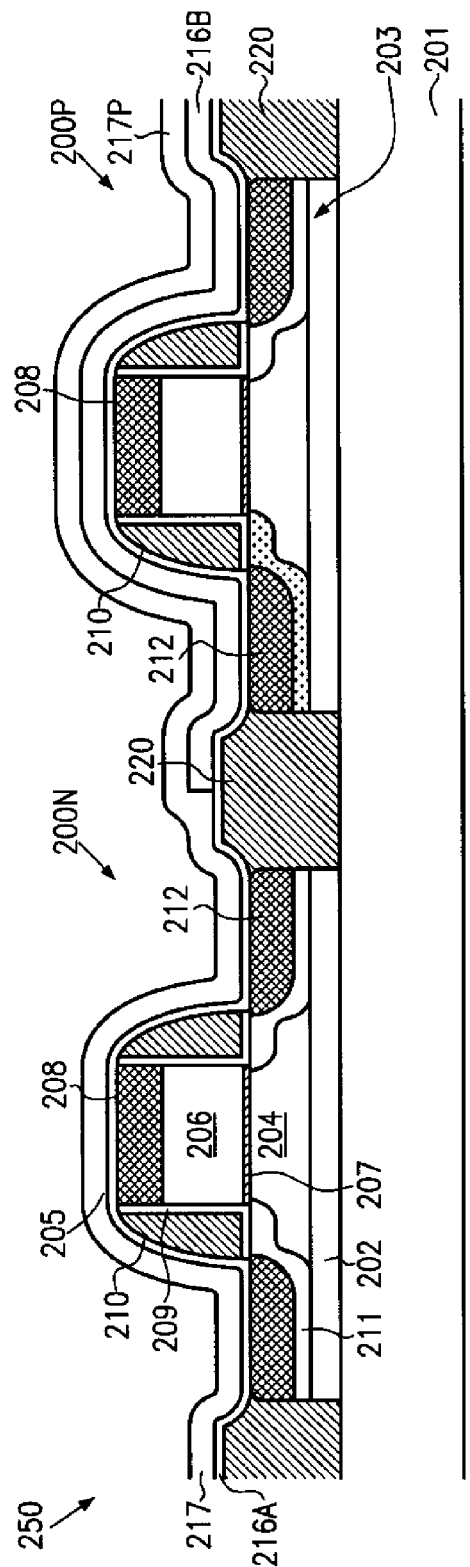

FIG. 2j schematically shows the semiconductor device 250 after completion of the treatment 263 and the removal of the resist mask 242, thereby leaving a low stress layer 217p, which does not significantly contribute to the total stress of the second transistor element 200p. Further processing may be continued by depositing an interlayer dielectric material, such as silicon dioxide, over the semiconductor device 250 and forming respective contact openings by using the layers 216b and 217, on the one hand, and the layer 217, on the other hand, as etch stop layers. It should be noted that the difference in thickness of the contact etch stop layer for the first transistor 200n, i.e., the layer 217, and for the second transistor 200p, i.e., the layer 216p in combination with the layer 217p, does not substantially affect the contact hole formation process, as still the liner 216a is provided in both transistor elements and may therefore serve as an additional etch stop layer in opening the respective layer 217 at the transistor 200n on the one hand, and the layer 217p in combination with the layer 216p at the transistor 200p on the other hand.

Figure 3A:
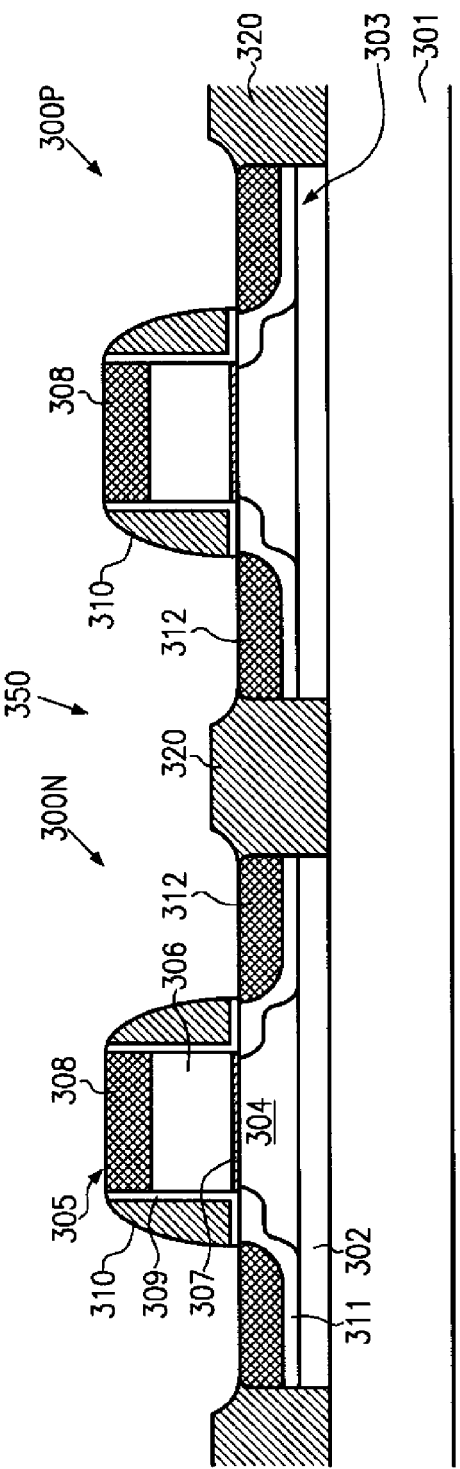

FIG. 3a schematically shows in cross-section a semiconductor device 350, including a first transistor element 300n and a second transistor element 300p, which may have the configuration as described with reference to FIGS. 1a and 2a. Hence, corresponding components are indicated by the same numerals, except for a leading "3" instead of a leading "1" or "2." Consequently, a detailed description of these components is omitted here.

Figure 3B:
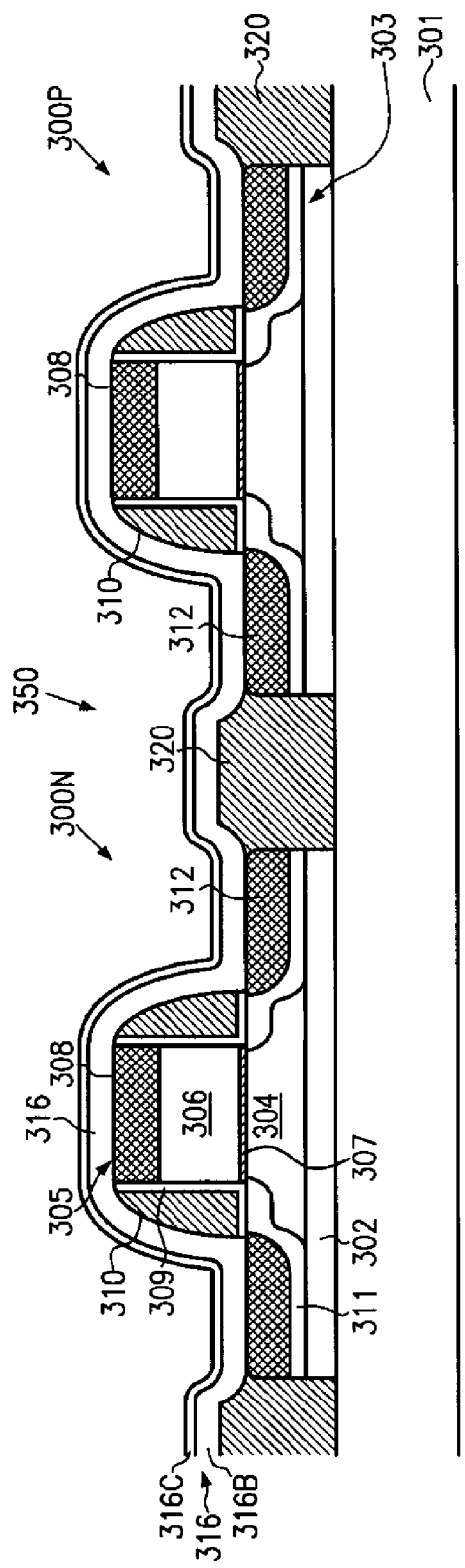

FIG. 3b schematically shows the semiconductor device 350 having formed thereon a dielectric layer 316, which may comprise a stress-inducing layer 316b, for instance formed from silicon nitride, and a liner 316c, for instance formed from silicon dioxide. With respect to the formation of the liner 316c and the stress-inducing layer 316b, the same criteria apply as previously outlined with reference to the liners 216a, 216c and the stress-inducing layer 216b. For example, the stress-inducing layer 316b may comprise compressive stress, which may be transferred to the second transistor element 300p while a tensile stress is to be created in the first transistor element 300n.

Figure 3C:
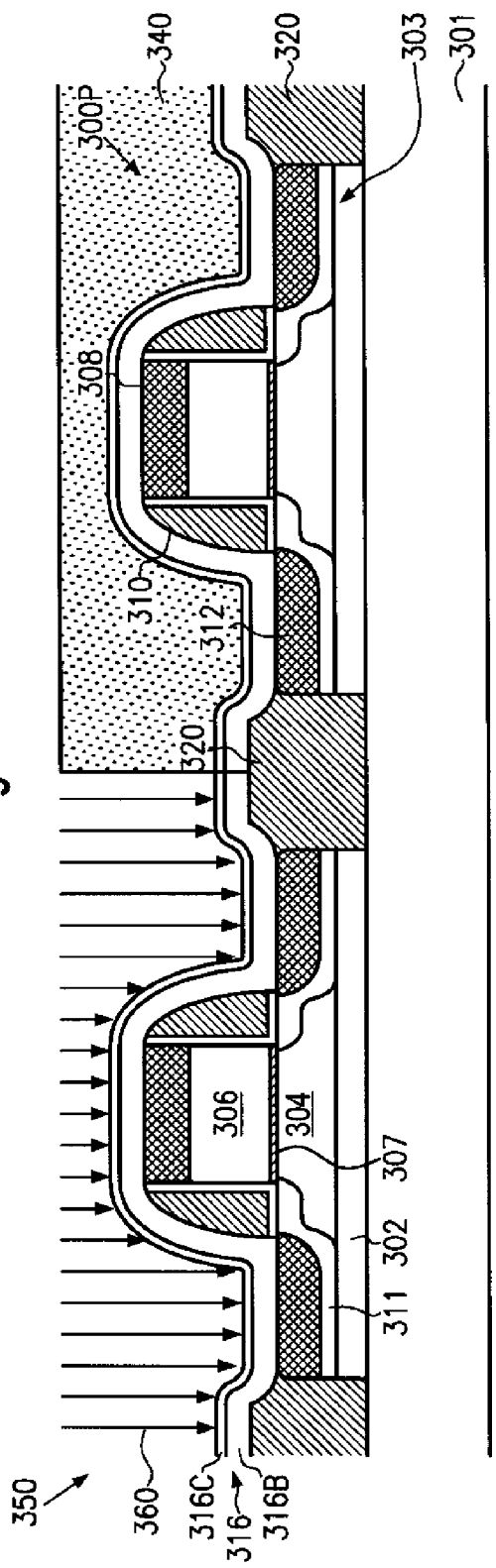

FIG. 3c schematically shows the semiconductor device 350 with a resist mask 340 formed thereon, which covers the second transistor element 300p and exposes the first transistor element 300n. Furthermore, the semiconductor device 350 is subjected to a plasma etch process 360 to remove the exposed portions of the liner 316c and the stress-inducing layer 316b. Corresponding plasma etch recipes are well established in the art and process parameters may be used as are also employed during the formation of the spacer elements 310.

FIG. 3d schematically shows the semiconductor device 350 after completion of the plasma etch process 360 and after removal of the resist mask 340, thereby leaving the second transistor 300p with the stress-inducing layer 316b and the liner 316c, while the first transistor 300n is subsequently completely exposed.

FIG. 3e schematically shows the semiconductor device 350 having formed thereon a second dielectric layer 317 with a specified intrinsic stress, such as a tensile stress that is to be transferred to the channel region 304 of the first transistor element 300n. Regarding the deposition parameters and the characteristics of the dielectric layer 317, the same criteria apply as previously explained with reference to the layers 117, 217.

FIG. 3f schematically shows the semiconductor device 350 with a further resist mask 341 formed thereon, which covers the first transistor element 300n while exposing the second transistor element 300p. Furthermore, the semiconductor device 350 is exposed to a plasma etch atmosphere 361 to remove the exposed portion of the dielectric layer 317. Corresponding etch recipes are well established, for instance in the form of recipes as are used during the formation of the spacer element 310. During the etch process 361, the liner 316c acts as an etch stop layer or an etch indicator layer, thereby enabling reliable control of the etch process 361. After the removal of the exposed portion of the layer 317, any remaining parts of the liner 316c that have not been consumed by the etch process 361 may, according to some embodiments, be removed by, for instance, a wet chemical etch process on the basis of HF. Thereafter, the resist mask 341 may be removed.

FIG. 3g schematically shows the semiconductor device 350 with the layer 316b inducing, for instance, compressive stress in the channel region 304 of the second transistor 300p and with the remaining layer 317 inducing, for instance, tensile stress in the channel region 304 of the first transistor element 300n. As in the previously explained embodiments, further processing of the semiconductor device 350 may continue with the deposition of an interlayer dielectric material 380, for instance in the form of silicon dioxide, and with the forming of contact openings 381, wherein the stress-inducing layers 317 and 316b may effectively be used as etch stop layers during the anisotropic etch process.

As a result, the present invention provides a technique that enables the formation of stress-inducing dielectric layers that are in direct contact with transistor structures, or that are located in close proximity above the transistor structures, wherein conventional and well-approved processes such as wet chemical etch processes, plasma etch processes, ion implantation or plasma treatment processes may be employed to provide different types of stress-inducing layers at different locations. Hence, the stress-determining parameters are well controllable and allow efficient stress engineering. In particular, the stress induced in respective channel regions of transistor elements may be substantially controlled by the dielectric layer, which may also act as a contact etch stop layer, thereby also significantly facilitating the stress engineering, since the stress is substantially determined by a single, well-controllable component rather than by two or more components, such as sidewall spacers in combination with contact etch stop layers. It should be appreciated that the illustrative embodiments described with reference to the drawings may be combined or certain process steps may be replaced by process steps of other embodiments in any appropriate fashion.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first dielectric layer above a first transistor element and a second transistor element, said first dielectric layer having a first specified intrinsic mechanical stress;
   forming a first liner on said first dielectric layer above said first and said second transistor elements, said liner being selectively etchable with respect to said first dielectric layer;
   selectively etching said first liner above said first transistor element while covering said second transistor element with a first resist mask;
   removing said first resist mask and removing a first portion of said first dielectric layer from above said first transistor element by selectively etching said first dielectric layer with a wet etch process while using said first liner over said second transistor element as an etch mask;
   forming a second dielectric layer above said first transistor element and a second portion of said first liner and said first dielectric layer formed above said second transistor element, said second dielectric layer having a second intrinsic stress differing from said first intrinsic stress; and
   selectively modifying said second intrinsic stress in a second portion of said second dielectric layer above said second portion of said first dielectric layer and said second transistor element by performing an ion bombardment process on said second portion of said second dielectric layer.

2. The method of claim 1, wherein selectively modifying said second intrinsic stress in said second portion of said second dielectric layer above said second portion of said first liner, said first dielectric layer and said second transistor element comprises forming a second resist mask to cover a first portion of said second dielectric layer above said first transistor element and to expose said second portion of said second dielectric layer prior to performing said ion bombardment process on said second portion of said second dielectric layer.

3. The method of claim 2, further comprising, prior to forming said second dielectric layer, forming a third resist mask to cover said first transistor element, removing said first liner above said second portion of said first dielectric layer by etching, and removing said third resist mask.

4. The method of claim 1, wherein selectively etching said first liner is performed as a wet etching process.

5. The method of claim 1, further comprising, prior to forming said first dielectric layer, forming a second liner above said first and said second transistor elements, said second liner being selectively etchable with respect to said first dielectric layer.

6. The method of claim 5, wherein a material composition of said first and second liners differs from a material composition of said first dielectric layer.

* * * * *